US006618459B1

(12) United States Patent
Tada

(10) Patent No.: US 6,618,459 B1
(45) Date of Patent: Sep. 9, 2003

(54) RADIO COMMUNICATION DEVICE AND METHOD OF BIT SYNCHRONIZATION PULL-IN IN THE SAME

(75) Inventor: Ken-Ichi Tada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/317,951

(22) Filed: May 25, 1999

(30) Foreign Application Priority Data

May 27, 1998 (JP) .......................... 10-145428

(51) Int. Cl.[7] .............................. H03D 3/24; H04L 7/00
(52) U.S. Cl. .................. 375/376; 375/371; 375/373
(58) Field of Search .............................. 375/327, 371, 375/373, 376; 327/141, 155, 156, 162, 163; 331/1 A, 1 R, 17, 18, 25

(56) References Cited

U.S. PATENT DOCUMENTS

| 4,166,984 A | * | 9/1979 | Jenkins ..................... 331/1 A |
| 4,543,540 A | * | 9/1985 | Linder ........................ 331/1 A |
| 6,101,230 A | * | 8/2000 | Chun et al. ................. 375/355 |
| 6,337,891 B1 | * | 1/2002 | Kim ........................... 375/376 |

FOREIGN PATENT DOCUMENTS

| CN | 97119107.7 | 5/1998 |
| JP | 1-284028 | 11/1989 |
| JP | 6-152502 | 5/1994 |
| JP | 6-268700 | 9/1994 |
| JP | 7-336342 | 12/1995 |
| JP | 8-8811 | 1/1996 |
| JP | 2535226 | 6/1996 |
| JP | 9-36737 | 2/1997 |
| JP | 9-135240 | 5/1997 |

OTHER PUBLICATIONS

Japanese Opposition, dated Mar. 23, 2000, with English language translation of Japanese Examiner's comments.
Chinese Office Action with English translation of pertinent portions.

* cited by examiner

Primary Examiner—Betsy L. Deppe
(74) Attorney, Agent, or Firm—Whitham, Curtis & Christofferson, P.C.

(57) ABSTRACT

There is provided a radio communication device including (a) a radio-receiving circuit which receives a radio signal, and transmits a receipt signal in accordance with the received radio signal, (b) a clock-generating circuit which generates a data-receiving clock, (c) a data-receiving circuit which receives the receipt signal in accordance with the data-receiving clock, (d) a phase-difference detecting circuit which detects a difference in a phase between the receipt signal and the data-receiving clock, (e) a phase-difference correcting circuit which varies a correction for a phase of the data-receiving clock in accordance with the difference in a phase detected by the phase-difference detecting circuit, and (f) a maximum correction establishing circuit which establishes a maximum correction for a phase of the data-receiving clock. In accordance with the radio communication device, when a data-receiving clock follows a radio signal in a phase, a correction for a phase of the data-receiving clock is varied in accordance with a difference in a phase between a received radio signal and the data-receiving clock, and a maximum correction for a phase of the data-receiving clock is also varied, which ensures higher accuracy with which a radio signal is received. As a result, it is possible to accomplish phase follow-up or synchronized receipt at an enhanced rate and with higher accuracy.

42 Claims, 12 Drawing Sheets

RADIO COMMUNICATION DEVICE AND METHOD OF BIT SYNCHRONIZATION PULL-IN IN THE SAME

BACKGROUND OF THE INVENTION

1. Field of the Invention

The invention relates to a radio communication device and a method of accomplishing bit synchronization pull-in or phase follow-up, and more particularly to a selective calling radio-receiver and a method of accomplishing bit synchronization pull-in.

2. Description of the Related Art

FIG. 1 illustrates an example of a conventional radio communication device. The illustrated radio communication device is constituted as a selective calling radio-receiver. The selective calling radio-receiver is comprised of an antenna 101 through which a radio signal is received, a signal-receiving circuit 102 receiving a radio signal from the antenna 101, and a decoder 103 decoding a radio signal transmitted from the signal-receiving circuit 102.

A radio signal received through the antenna 101 is demodulated in the signal-receiving circuit 102, and the thus demodulated signal is transmitted as a demodulated output signal 105 to the decoder 103.

The decoder 103 is comprised of a clock-generating circuit 106 generating a data-receiving clock, a phase-difference correcting circuit 107 which corrects a phase of the data-receiving clock, a data-receiving circuit 108 which receives the data-receiving clock from the clock-generating circuit 106, and then, receives the demodulated output signal 105 from the signal-receiving circuit 102 in accordance with the data-receiving clock, and a data-storing memory 109 which stores therein data having been received in the data-receiving circuit 108.

In a selective calling radio-receiver, synchronization in a phase is generally established between a received signal and a data-receiving clock in order for a data-receiving circuit to receive a signal at an appropriate timing. In the conventional radio communication device illustrated in FIG. 1, the above-mentioned synchronization in a phase was conducted by correcting a phase of the data-receiving clock with a certain correction, regardless of a difference in a phase between a received signal or the demodulated output signal 105.

The synchronization pull-in conducted in the radio communication device illustrated in FIG. 1 is effective when a difference in a phase between the received signal and the data-receiving clock is greater than the above-mentioned certain correction. However, even when the difference in a phase becomes smaller than a predetermined correction, a correction is kept unchanged, that is, a correction is kept at a fixed value, which reduces accuracy in phase-synchronization.

This problem can be solved to some degree, if a correction is originally designed to have a small value, however, which is accompanied with another problem of reduction in phase following ability.

Japanese Unexamined Patent Publication No. 1-284028 has suggested a selective calling receiver including a circuit which operates a bit synchronization circuit only while a synchronization word signal is being received, after a position of the synchronization word has been detected.

Japanese Patent No. 2535226 (Japanese Unexamined Patent Publication No. 1-136077) has suggested a selective calling receiver comprising a receiver which receives a selective calling signal from a base station and outputs the received signal as a digital signal, a bit synchronization circuit which synchronizes the digital signal to an internal clock generated in an internal oscillation circuit, a frame synchronization signal receiving circuit which receives a frame synchronization signal which is intermittently transmitted thereto, a phase-difference detecting circuit which detects a phase-difference at the outset of signal-receiving, based on an internal phase correction signal transmitted from the bit synchronization circuit, a bit-difference detecting circuit which detects a difference in a bit of internal timing, based on an output transmitted from the frame synchronization signal receiving circuit, a correction determining circuit which determines a correction based on outputs transmitted from the phase-difference detecting circuit and the bit-difference detecting circuit, and a correction circuit making a correction for a frequency of the internal oscillation circuit.

Japanese Unexamined Patent Publication No. 6-152502 has suggested a selective calling radio-receiver comprising a turning point detecting circuit which detects a turning point of a received signal, a timing generator which generates internal standard clock, a phase comparator which calculates a correction for a phase between an output transmitted from the turning point detecting circuit and the internal standard clock, and a variable divider which receives the correction, determines a division ratio of the internal standard clock, and reproduces a clock.

Japanese Unexamined Patent Publication No. 8-8811 has suggested a synchronization establishing apparatus which detects spatial TDMA timing with an accuracy of 1/m symbol, based on a detecting timing of a unique word.

Japanese Unexamined Patent Publication No. 9-36737 has suggested a phase-synchronous circuit including an A/D converter which converts a voltage transmitted from a low-pass filter into a digital signal, a standard value setting circuit in which a level equal to a half of an output level of the A/D converter is determined as a standard level, a comparator which compares an input level transmitted from the A/D converter to the standard level, a programmable multiplier, and a memory storing data used for controlling the programmable multiplier in accordance with a difference between the input level and the standard level.

Japanese Unexamined Patent Publication No. 7-336342 has suggested a clock reproducing circuit including an edge detecting circuit which detects an edge in a received signal and detects synchronization timing included in the received signal, a standard signal generating circuit generating a plurality of standard signals having different phases from one another, but having a common frequency, and an output selecting circuit selecting a standard signal among the plurality of standard signals, which standard signal has a phase closet to synchronization timing included in the received signal, and transmitting the thus selected standard signal as a clock signal. In accordance with the clock reproducing circuit, the clock signal is not gradually synchronized to synchronization timing included in a received signal, but is immediately synchronized to a timing relatively close to the synchronization timing.

Japanese Unexamined Patent Publication No. 6-268700 has suggested a timing reproducing circuit including a first circuit measuring estimated distances between m sample points and a zero-cross point, a second circuit calculating an average among the thus measured estimated distances, a third circuit converting the thus calculated m averages into average distances between rising points of m reproduced clocks and a next zero-cross point, detecting a difference in a phase between fall edges of the reproduced clocks and the zero-cross point, controls a phase in the reproduced clocks at synchronization, and controls an up-down counter based on both upper most bits of the estimated distances and the zero-cross detecting signal, to thereby control a difference in a phase between the zero-cross point of the received signal and the fall edges of the reproduced clocks.

Japanese Unexamined Patent Publication No. 9-135240 has suggested a digital phase-synchronous circuit including an N-bit counter which divides an output transmitted from digital VCO to thereby transmit N divided signals, a selector which switches the divided signals to a symbol clock in response to a switched rate, and an adder positioned between the N-bit counter 6 and the selector 7. When a rate is switched, a switch transmits phase offset values established in accordance with a plurality of transfer rates, to the adder, and the adder transmits a divided output to the selector.

The above-mentioned Publications are accompanied with the same problem as the problem having been explained in the conventional radio communication device with reference to FIG. 1.

SUMMARY OF THE INVENTION

In view of the above-mentioned problem, it is an object of the present invention to provide a radio communication device and a method of accomplishing bit synchronization both of which are capable of enhancing an accuracy with which phase-synchronization is accomplished between a received signal and a data-receiving clock, and further enhancing phase following ability.

In one aspect of the present invention, there is provided a radio communication device receiving radio signals in accordance with a data-receiving clock, including a phase-difference correcting circuit which varies a correction for a phase of the data-receiving clock in accordance with a difference in a phase between received radio signal and the data-receiving clock.

In accordance with the radio communication device, an appropriate correction for a phase of a data-receiving clock is selected in accordance with a difference in a phase between a received radio signal and a data-receiving clock unlike a conventional radio communication device where a phase of a data-receiving clock is always corrected with a fixed correction. As a result, it is possible to enhance an accuracy with which a radio signal is received.

The radio communication device preferably further includes a maximum correction establishing circuit which in advance establishes a maximum correction for a phase of the data-receiving clock, and determines a correction for a phase of the data-receiving clock within the thus established maximum correction.

It would be possible to control an accuracy with which a radio signal is received, into a desired range by defining a maximum range of a correction.

It is preferable that the phase-difference correcting circuit makes a correction for a phase of the data-receiving clock, which correction is equal to the maximum correction, when a difference in a phase between the radio signal and the data-receiving clock is equal to or greater than the maximum correction, whereas the phase-difference correcting circuit makes a correction for a phase of the data-receiving clock, which correction is determined to compensate for a difference in a phase between the radio signal and the data-receiving clock, when the difference in a phase is equal to or smaller than the maximum correction.

It is preferable that the maximum correction established by the maximum correction establishing circuit is variable.

The radio communication device may further include an oscillator transmitting a pulse signal by which the data-receiving clock is generated, in which case, the oscillator is preferably an oscillator transmitting pulse signals at a fixed frequency, and the maximum correction and the difference in a phase may be established preferably in the form of the number of pulse signals generated by the oscillator.

By representing the maximum correction and the difference in a phase with the number of pulse signals generated by the oscillator, phase-synchronization control could be readily carried out on the basis of the number of pulses.

It is preferable that the phase-difference correcting circuit is comprised of a comparator comparing the difference in a phase to the maximum correction, and a selector selecting a smaller one between the difference in a phase and the maximum correction in accordance with a comparison result provided from the comparator, and determining the smaller one as a correction for a phase of the data-receiving clock.

As is obvious to those skilled in the art, the phase-difference correcting circuit may be designed to have another structure.

It is preferable that the maximum correction establishing circuit is comprised of a memory storing therein a plurality of corrections having different values from one another, and a selector selecting one of the plurality of corrections.

For instance, the maximum correction establishing circuit selects a first correction before a synchronization signal in the radio signal is detected, and selects a second correction after the synchronization signal has been detected, the second correction being smaller than the first correction.

It is generally considered that there is a significant difference between a received signal and a data-receiving clock before a synchronization signal in a radio signal is detected, in particular, immediately after a radio signal has been received. Hence, it is preferable to first select a greater correction (first correction), and then, select a smaller correction (second correction) after a synchronization signal has been detected.

It is preferable that the maximum correction establishing circuit receives the difference in a phase, and a first correction which is a maximum one among the plurality of corrections, and that the maximum correction establishing circuit switches a correction for a phase of the data-receiving clock from the first correction to a third correction smaller than the first correction in response to the difference in a phase becoming smaller than the first correction, even when the maximum correction establishing circuit selects the first correction.

It is also preferable that the phase of the data-receiving clock is compensated for by the third correction until receipt of a synchronization signal in the radio signal has been completed.

That is, it is preferable that the third correction is used until a synchronization signal is completely received, and that a correction smaller than the third correction, such as the above-mentioned second correction, is used after a synchronization signal has been completely received. Thus, it is possible to enhance an accuracy in phase control by gradually decreasing a correction in accordance with the difference in a phase.

It is preferable that the third correction is next smaller than the first correction among the plurality of corrections.

Before a synchronization signal is received, there remains possibility that a phase is accidentally synchronized by noises. Thus, it is possible to avoid such possibility by switching a correction from the first correction to the third correction which is next smaller than the first correction.

The radio communication device in accordance with the present invention may be applied to any type of device. For instance, the radio communication device may be designed to constitute a selective calling radio-receiver.

There is further provided a radio communication device including (a) a radio-receiving circuit which receives a radio signal, and transmits a receipt signal in accordance with the received radio signal, (b) a clock-generating circuit which generates a data-receiving clock, (c) a data-receiving circuit which receives the receipt signal in accordance with the data-receiving clock, (d) a phase-difference detecting circuit which detects a difference in a phase between the receipt signal and the data-receiving clock, (e) a phase-difference correcting circuit which varies a correction for a phase of the data-receiving clock in accordance with the difference in a phase detected by the phase-difference detecting circuit, and (f) a maximum correction establishing circuit which establishes a maximum correction for a phase of the data-receiving clock.

The radio communication device makes it possible to control a correction for a phase in accordance with a difference in a phase between a received radio signal and a data-receiving clock, and further control a maximum correction for the same, ensuring an accuracy with which a radio signal is received and synchronization pull-in or phase follow-up at an enhanced rate.

It is preferable that the radio communication device further includes an oscillator which supplies a pulse signal to the clock-generating circuit, and a divider which divides the pulse signal.

It is preferable that the phase-difference detecting circuit detects a difference in a phase between a turning point of the receipt signal and a rise edge of the data-receiving clock.

It is preferable that the phase-difference correcting circuit varies the number of division of the pulse signal by one to thereby correct a phase of the data-receiving clock.

It is preferable that the phase-difference correcting circuit corrects a phase of the data-receiving clock so that a turning point of the receipt signal is synchronized to a rise edge of the data-receiving clock and the data-receiving circuit receives the receipt signal at a fall edge of the data-receiving clock.

The phase-difference correcting circuit makes it possible to receive a signal at a center of a symbol in a demodulated waveform of the received signal.

For instance, the maximum correction establishing circuit may be comprised of (a) a synchronization signal detecting circuit which detects a synchronization signal constituting a part of the receipt signal, (b) a memory which stores a plurality of corrections each having a different value from one another, and (c) a correction control circuit which selects a correction for a phase of the data-receiving clock among the plurality of corrections, in which case, the correction control circuit may be designed to select a first correction before the synchronization signal is detected, and select a second correction after the synchronization signal detecting circuit has detected the synchronization signal, the second correction being smaller than the first correction.

A phase may be significantly different between a received signal and a data-receiving clock immediately after a radio signal is received. Hence, it is preferable to first select a greater correction (first correction), and then, a smaller correction (second correction) after a synchronization signal has been detected.

It is preferable that the correction control circuit temporarily selects the first correction after having selected the second correction.

A symbol rate may be changed in dependence on a signal transmission system, and a phase maybe deviated at that time. In such a case, it is preferable to temporarily select a great correction (first correction) again.

In another aspect of the present invention, there is provided a method of establishing synchronization in a radio communication device, including the steps of (a) receiving a radio signal in accordance with a data-receiving clock, and (b) varying a correction for a phase of the data-receiving clock in accordance with a difference in a phase between the radio signal and the data-receiving clock.

In accordance with method, an appropriate correction for a phase of a data-receiving clock is selected in accordance with a difference in a phase between a received radio signal and a data-receiving clock unlike a conventional radio communication device where a phase of a data-receiving clock is always corrected with a fixed correction. As a result, it is possible to enhance an accuracy with which a radio signal is received.

The method may further include the step of establishing a maximum correction which is maximum among the correction for a phase of the data-receiving clock, and wherein the phase of data-receiving clock is corrected within the maximum correction in the step (b).

It is preferable that the difference in a phase is equal to or greater than the maximum correction, a correction equal to the maximum correction is made, and when the difference in a phase is smaller than the maximum correction, a correction is made in accordance with the difference in a phase, in the step (b).

The method may further include the step of varying the maximum correction.

It is preferable that a plurality of corrections each having a different value from one another is in advance established, one of the corrections is selected, and the phase of the data-receiving clock is corrected with the thus selected correction in the step (b).

It is preferable that a first correction is selected before a synchronization signal in the radio signal is detected, and a second correction smaller than the first correction is selected after the synchronization signal has been detected.

It is preferable that a correction for a phase of the data-receiving clock is switched from the first correction to a third correction smaller than the first correction in response to the difference in a phase becoming smaller than the first correction, even when the first correction is selected in the step (b).

It is preferable that the third correction is next smaller than the first correction among the plurality of corrections, in which case, it is preferable that the phase of the data-receiving clock is corrected by the third correction until receipt of the synchronization signal has been completed.

There is further provided a method of establishing synchronization in a radio communication device, including the steps of (a) receiving a radio signal, and transmitting a receipt signal in accordance with the thus received radio signal, (b) generating a data-receiving clock, (c) detecting a difference in a phase between the receipt signal and the data-receiving clock, (d) establishing a maximum correction for a phase of the data-receiving clock, (e) varying a correction for a phase of the data-receiving clock in accordance with the difference in a phase, having been detected in the step (c), and (f) receiving the receipt signal in accordance with the data-receiving clock having a phase having been corrected in the step (e).

The method makes it possible to control a correction for a phase in accordance with a difference in a phase between a received radio signal and a data-receiving clock, and further control a maximum correction for the same, ensuring an accuracy with which a radio signal is received and synchronization pull-in or phase follow-up at an enhanced rate.

For instance, the step (e) may be comprised of (e1) comparing the difference in a phase to the maximum correction, and (e2) selecting a smaller one between the difference in a phase and the maximum correction in accordance with a result of the step (e1), and determining the thus selected smaller one as a correction for a phase of the data-receiving clock.

For instance, a difference in a phase between a turning point in the receipt signal and a rise edge in the data-receiving clock is detected in the step (c).

For instance, a phase of the data-receiving clock is corrected in the step (e) so that a turning point of the receipt signal is synchronized to a rise edge of the data-receiving clock and the receipt signal is received at a fall edge of the data-receiving clock.

For instance, a first correction may be selected before a synchronization signal in the radio signal is detected, and a second correction smaller than the first correction may be selected after the synchronization signal has been detected, in the step (e).

For instance, first selection may be temporarily selected again even after the second correction has been selected in the step (e).

In accordance with the above-mentioned present invention, when a data-receiving clock follows a radio signal in a phase, a correction for a phase of the data-receiving clock is varied in accordance with a difference in a phase between a received radio signal and the data-receiving clock, and, if necessary, a maximum correction for a phase of the data-receiving clock is also varied. This ensures higher accuracy with which a radio signal is received. As a result, it is possible to accomplish phase follow-up or synchronized receipt at an enhanced rate and with higher accuracy.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 1:
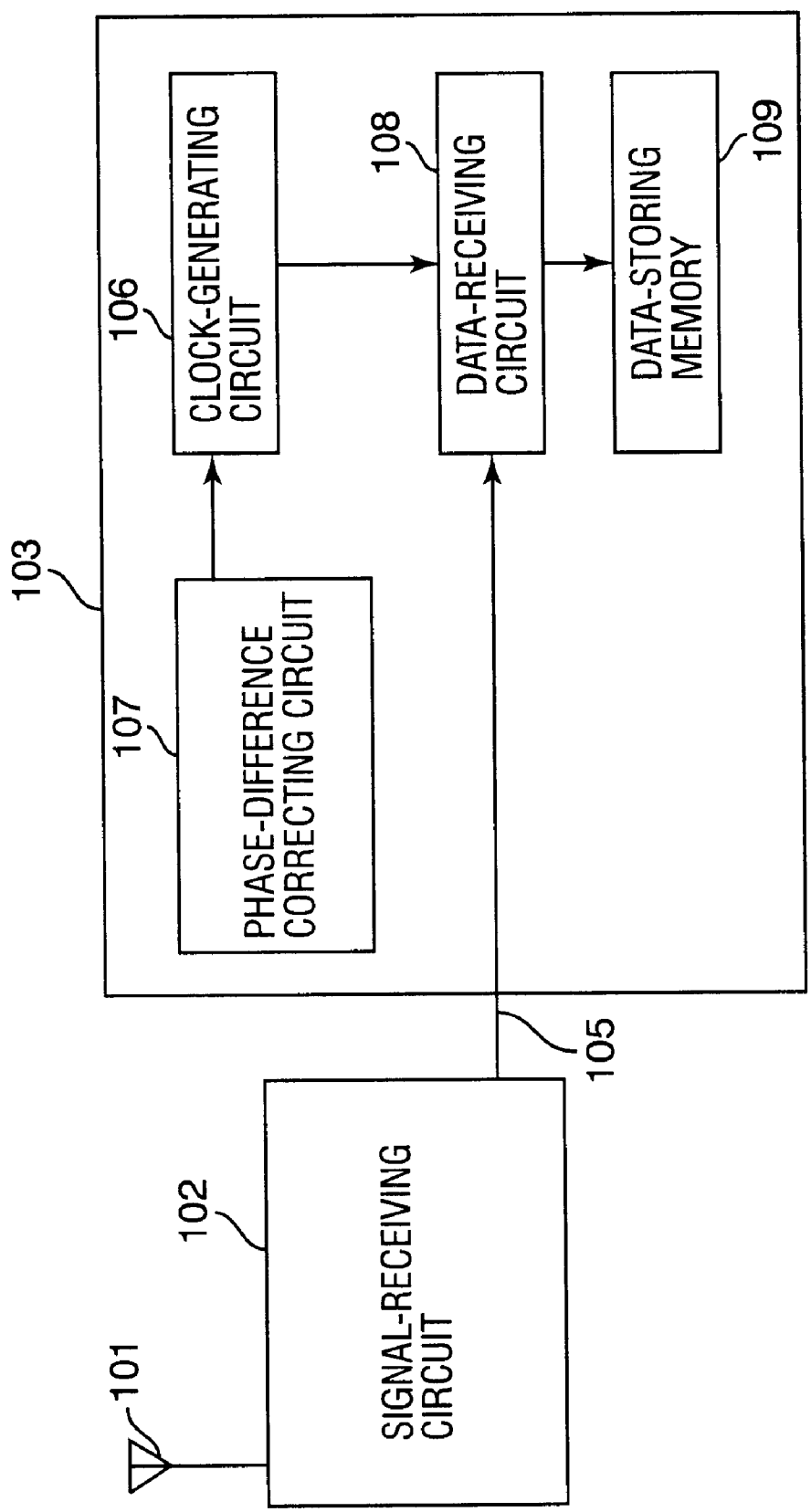
FIG. 1 is a block diagram of a conventional radio communication device.
Figure 2:
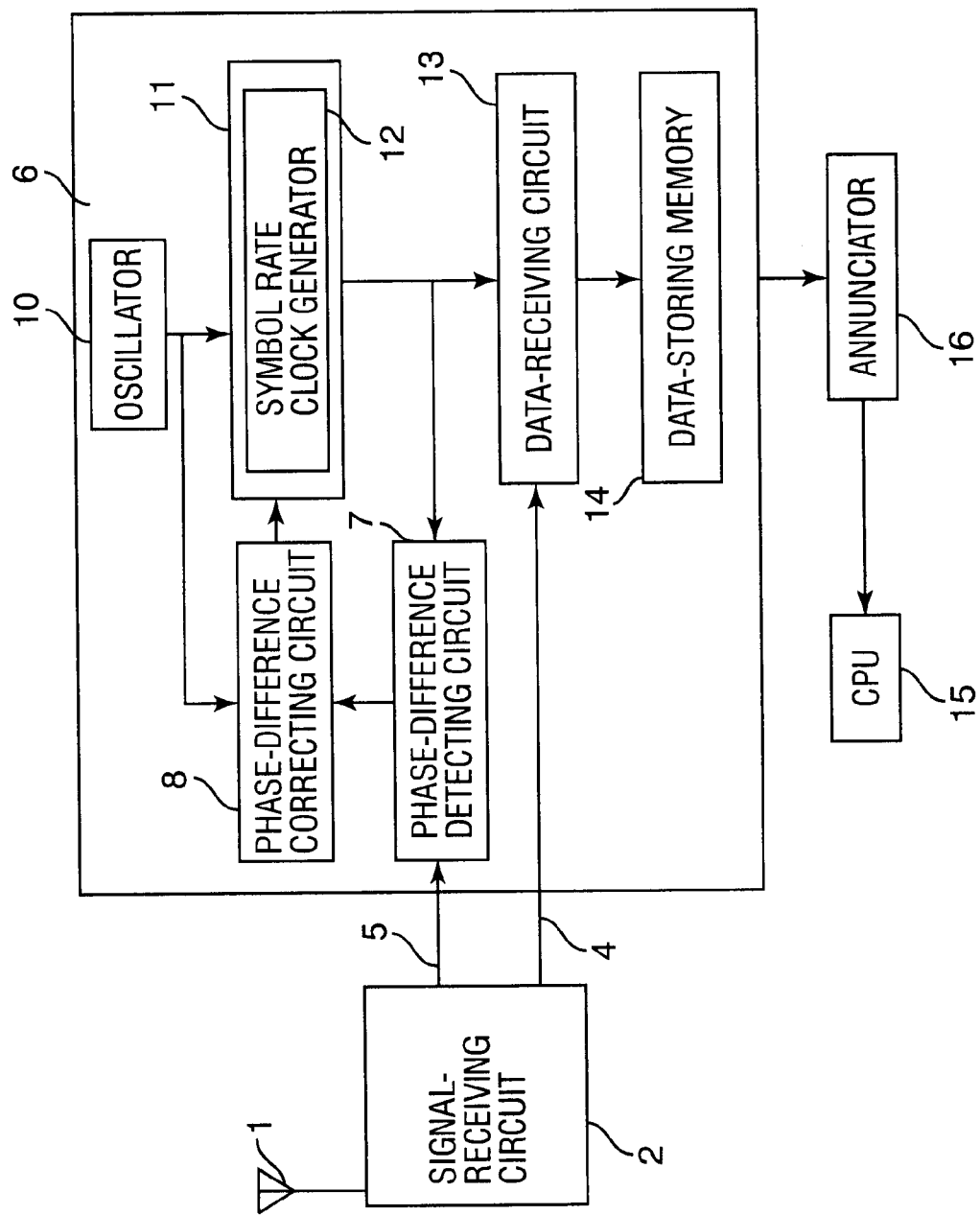
FIG. 2 is a block diagram of a radio communication device in accordance with the first embodiment of the present invention.

FIG. 2 illustrates a radio communication device in accordance with the first embodiment. The radio communication device is constituted as a selective calling radio-receiver.

The radio communication device in accordance with the first embodiment is comprised of an antenna 1 through which a radio signal is received, a signal-receiving circuit 2 receiving a radio signal from the antenna 1, and a decoder 6 decoding an output signal transmitted from the signal-receiving circuit 2.

Figure 3:
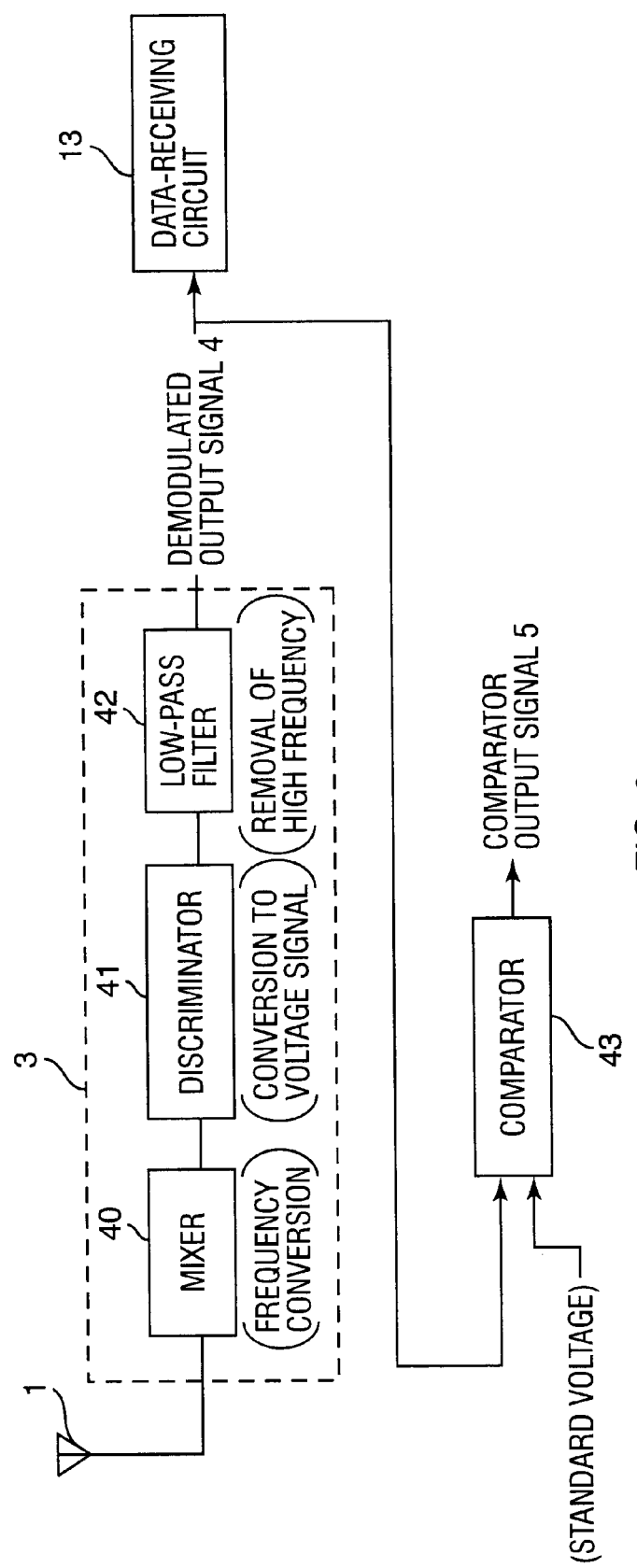
FIG. 3 is a block diagram of an example of a signal-receiving circuit.

The signal-receiving circuit 2 includes an IF detection circuit (not illustrated in FIG. 2, but illustrated in FIG. 3). A radio signal which the signal-receiving circuit 2 has received from the antenna 1 is converted into a demodulation output signal 4 and a comparator output signal 5 by the IF detection circuit. The demodulation output signal 4 and the comparator output signal 5 are both transmitted to the decoder 6.

FIG. 3 illustrates an example of the IF detection circuit. The IF detection circuit 3 is comprised of a mixer 40, a discriminator 41, and a low-pass filter 42.

A radio signal having been received at the antenna 1 is converted by the mixer with respect to a frequency, and then, further converted to a voltage signal in the discriminator 41. Then, a high frequency is removed from the voltage signal by the low-pass filter 42. As a result, there is obtained the demodulated output signal 4.

In addition, the thus obtained demodulated output signal 4 is compared to a standard voltage in a comparator 43. Herein, the standard voltage is determined to be equal to a half voltage in an amplitude of the demodulated output signal 4. As a result, there is obtained the comparator output signal 5.

Referring back to FIG. 2, the decoder 6 is comprised of a phase-difference detecting circuit 7 detecting a difference in a phase between the comparator output signal 5 and a symbol rate clock as a data-receiving clock, a phase-difference correcting circuit 8 determining a correction for a phase of the symbol rate clock, a symbol rate clock generator 12 which generates a symbol rate clock as a data-receiving clock, an oscillator 10 which supplies a pulse signal to the symbol rate clock generator 12, a divider 11 which divides a pulse signal transmitted from the oscillator 10, a data-receiving circuit 13 which receives the demodulated output signal 4 in accordance with the symbol rate clock having a phase having been corrected by the phase-difference correcting circuit 8, and a data-storing memory 14 which stores received data therein.

The phase-difference detecting circuit 7 detects a difference in a phase between a turning point of the comparator output signal 5 and a rise edge of a symbol rate clock. A difference in a phase detected by the phase-difference detecting circuit 7 is detected as the number of pulses in a pulse signal generated from the oscillator 10. The symbol rate clock is also generated by the divider 11 dividing a pulse signal generated from the oscillator 10.

The phase-difference correcting circuit 8 determines a correction for a phase of the symbol rate clock in accordance with a difference in a phase, having been detected by the phase-difference detecting circuit 7. A phase of the symbol, rate clock is corrected by changing the number of division of the divider 11 by one.

The data-receiving circuit 13 receives the demodulated output signal 4 at a fall edge of the symbol rate clock, and stores the received demodulated output signal 4 in the data-storing memory 14.

A central processing unit (CPU) 15 and an annunciator 16 are electrically connected to the decoder 6. The annunciator 16 transmits a signal indicating that there has been a call, to CPU 15 when a message of a call has been stored in the data-storing memory 14.

Figure 4:
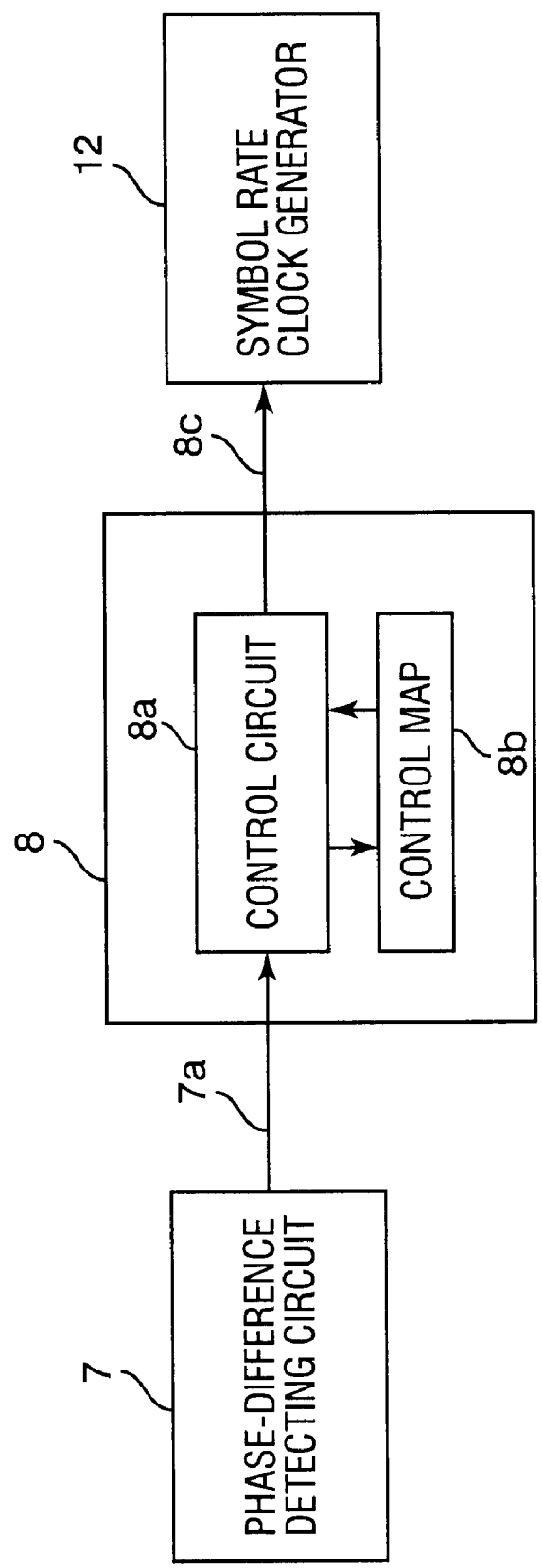
FIG. 4 is a block diagram of an example of a phase-difference correcting circuit.

FIG. 4 illustrates an example of the phase-difference correcting circuit 8 in the first embodiment.

As illustrated in FIG. 4, the phase-difference correcting circuit 8 is comprised of a control circuit 8a and a control map 8b electrically connected to the control circuit 8a. The control map 8b stores a map which has been made based on tests. The control map 8b defines a relation between a difference in a phase and a correction.

On receipt of a phase-difference signal 7a indicative of a difference in a phase from the phase-difference detecting circuit 7, the control circuit 8a made access to the control map 8b, and selects a correction corresponding to the phase-difference indicated by the phase-difference signal 7a. The thus selected correction is used for correcting a phase of the symbol rate clock. The control circuit 8a transmits a symbol rate clock phase correction signal 8c indicative of the thus selected correction, to the symbol rate clock generator 12.

An operation of the radio communication device in accordance with the first embodiment is explained hereinbelow.

A radio signal having been received through the antenna 1 is converted into the demodulated output signal 4 and the comparator output signal 5 in the signal-receiving circuit 2, and then, the demodulated output signal 4 and the comparator output signal 5 are transmitted to the data-receiving circuit 13 and the phase-difference detecting circuit 7, respectively.

The phase-difference detecting circuit 7 detects a difference in a phase between a turning point of the comparator output signal 5 and a rise edge of the symbol rate clock in the form of the number of pulses of a pulse signal transmitted from the oscillator 10. The thus detected difference in a phase is transmitted to phase-difference correcting circuit 8 as the phase-difference signal 7a, as illustrated in FIG. 4, and then, a correction for a phase of the symbol rate clock is determined in accordance with the detected difference in a phase. The thus determined correction is transmitted to the symbol rate clock generator 12 as the symbol rate clock phase correction signal 8c.

On receipt of the symbol rate clock phase correction signal 8c from the phase-difference correcting circuit 8, the symbol rate clock generator 12 corrects a phase of the symbol rate clock in accordance with the correction indicated by the symbol rate clock phase correction signal 8c, and transmits the thus corrected symbol rate clock to the data-receiving circuit 13.

On receipt of the symbol rate clock having a phase having been corrected by the phase-difference correcting circuit 8, the data-receiving circuit 13 receives the demodulated output signal 4 in accordance with the corrected symbol rate clock. The received demodulated output signal 4 is stored in the data-storing memory 14.

As having been explained so far, in accordance with the radio communication device, an appropriate correction for a phase of a symbol rate clock is selected in accordance with a difference in a phase between a received radio signal and a symbol rate clock unlike a conventional radio communication device where a phase of a data-receiving clock is always corrected with a fixed correction. As a result, it is possible to enhance an accuracy with which a radio signal is received.

Second Embodiment

Figure 5:
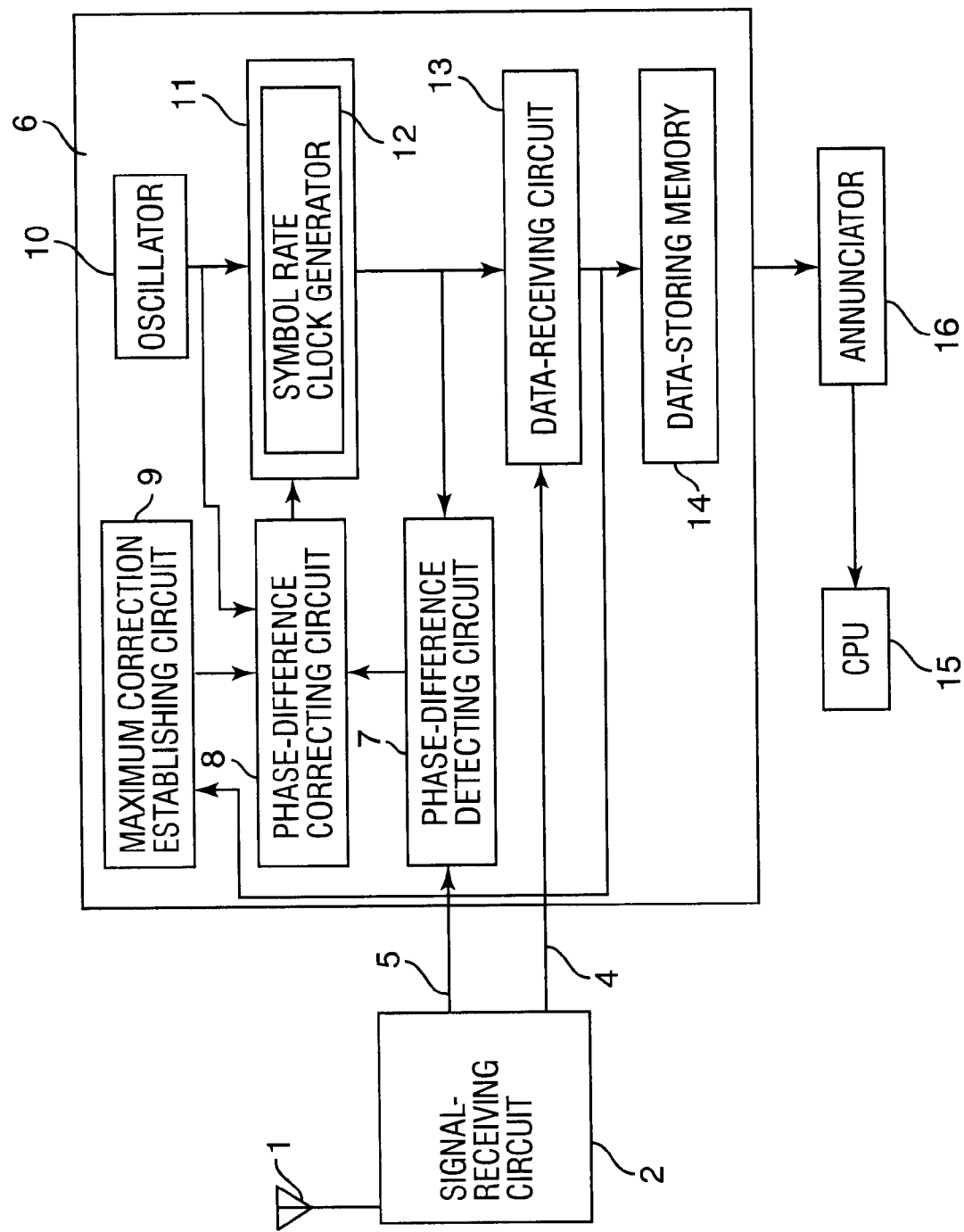
FIG. 5 is a block diagram of a radio communication device in accordance with the second embodiment of the present invention.

FIG. 5 illustrates a radio communication device in accordance with the second embodiment. The radio communication device is constituted as a selective calling radio receiver, similar to the first embodiment.

The radio communication device in accordance with the second embodiment is comprised of an antenna 1 through which a radio signal is received, a signal-receiving circuit 2 receiving a radio signal from the antenna 1, and a decoder 6 decoding an output signal transmitted from the signal-receiving circuit 2.

The signal-receiving circuit 2 includes such an IF detection circuit as illustrated in FIG. 3, similarly to the first embodiment. A radio signal which the signal-receiving circuit 2 has received from the antenna 1 is converted into a demodulation output signal 4 and a comparator output signal 5 by the IF detection circuit. The demodulation output signal 4 and the comparator output signal 5 are both transmitted to the decoder 6.

As illustrated in FIG. 5, the decoder 6 is comprised of a phase-difference detecting circuit 7 detecting a difference in a phase between the comparator output signal 5 and a symbol rate clock as a data-receiving clock, a phase-difference correcting circuit 8 determining a correction for a phase of the symbol rate clock, a maximum correction establishing circuit 9 which determines a maximum correction for a phase between the comparator output signal 5 and a symbol rate clock, a symbol rate clock generator 12 which generates a symbol rate clock as, a data-receiving clock, an oscillator 10 which supplies a pulse signal to the symbol rate clock generator 12, a divider 11 which divides a pulse signal transmitted from the oscillator 10, a data-receiving circuit 13 which receives the demodulated output signal 4 in accordance with the symbol rate clock having a phase having been corrected by the phase-difference correcting circuit 8, and a data-storing memory 14 which stores received data therein.

The phase-difference detecting circuit 7 detects a difference in a phase between a turning point of the comparator output signal 5 and a rise edge of a symbol rate clock. A difference in a phase detected by the phase-difference detecting circuit 7 is detected as the number of pulses in a pulse signal generated from the oscillator 10. The symbol rate clock is also generated by the divider 11 dividing a pulse signal generated from the oscillator 10.

The phase-difference correcting circuit 8 compares a difference in a phase, detected by the phase-difference detecting circuit 7 to the maximum correction determined by the maximum correction establishing circuit 9, and selects a smaller one as a correction for a phase of the symbol rate clock. Specifically, if a difference in a phase is greater than the maximum correction, the phase-difference correcting circuit 8 corrects a phase of the symbol rate clock by the maximum correction, whereas if the maximum correction is greater than a difference in a phase, the phase-difference correcting circuit 8 corrects a phase of the symbol rate clock by the difference in a phase. A phase of the symbol rate clock is corrected by changing the number of division of the divider 11 by one.

As mentioned above, a maximum range in which the phase-difference correcting circuit 8 corrects a phase of the symbol rate clock in one operation is determined by the maximum correction establishing circuit 9.

The maximum correction determined by the maximum correction establishing circuit 9 is also defined as the number of pulses in a pulse signal generated from the oscillator 10.

The maximum correction determined by the maximum correction establishing circuit 9 can be altered to another correction, if necessary.

The data-receiving circuit 13 receives the demodulated output signal 4 at a fall edge of the symbol rate clock, and stores the received demodulated output signal 4 in the data-storing memory 14.

A central processing unit (CPU) 15 and an annunciator 16 are electrically connected to the decoder 6. The annunciator 16 transmits a signal indicating that there has been a call, to CPU 15 when a message of a call has been stored in the data-storing memory 14.

Figure 6:
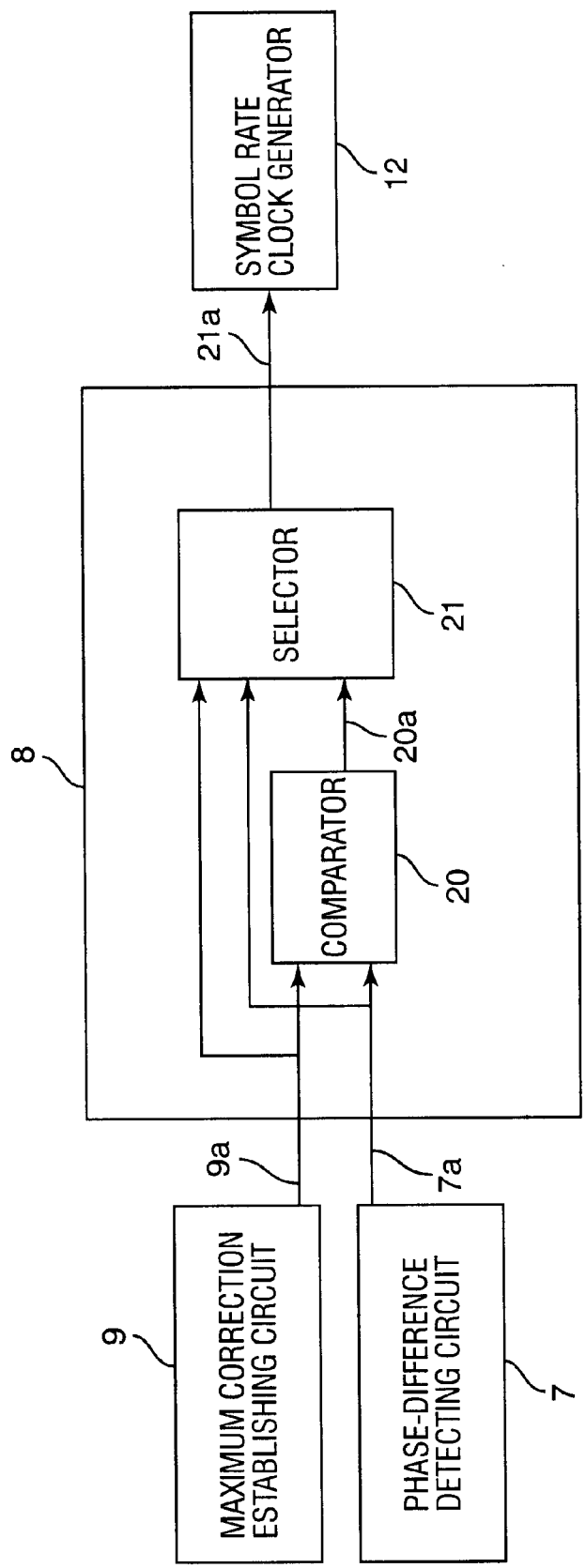
FIG. 6 is a block diagram of an example of a phase-difference correcting circuit.

FIG. 6 illustrates an example of the phase-difference correcting circuit 8 in the second embodiment.

As illustrated in FIG. 6, the phase-difference correcting circuit 8 is comprises of a comparator 20 and a selector 21. The comparator 20 receives a phase-difference signal 7a indicative of a difference in a phase between a radio signal and the symbol rate clock, from the phase-difference detecting circuit 7, and further receives a maximum correction signal 9a indicative of a maximum correction for a phase of the symbol rate clock, from the maximum correction establishing circuit 9. The phase-difference correcting circuit 8 compares the thus received the difference in phase and the maximum correction to each other.

The selector 21 receives a result 20a transmitted from the comparator 20, and always selects a smaller one between the difference in a phase and the maximum correction. The selector 21 determines the thus selected smaller one as a correction for a phase of the symbol rate clock, and transmits a symbol rate clock phase correction signal 21a indicative of the thus determined correction, to the symbol rate clock generator 12.

Figure 7:
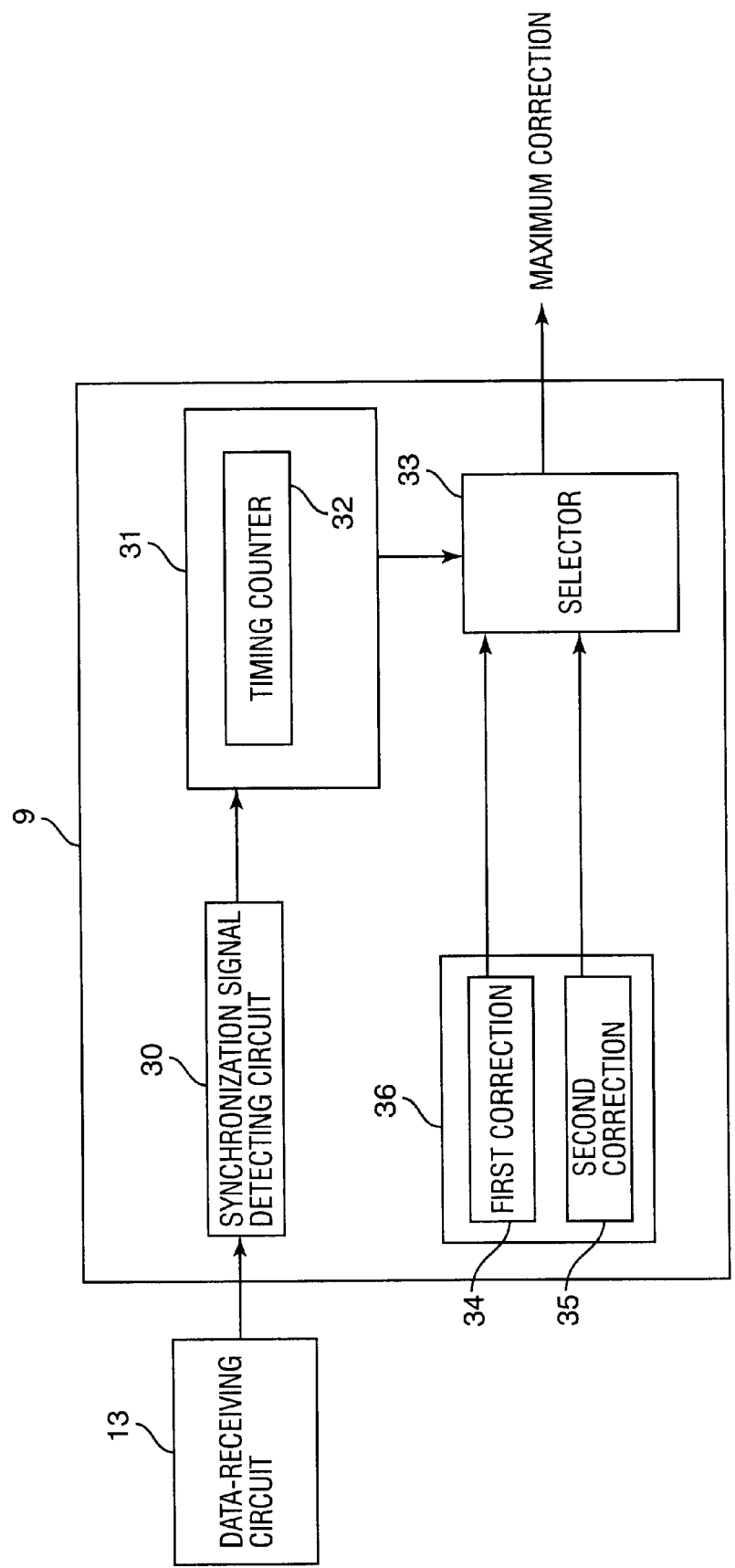
FIG. 7 is a block diagram of an example of a maximum correction establishing circuit.

FIG. 7 illustrates an example of a structure of the maximum correction establishing circuit 9 in the second embodiment.

As illustrated in FIG. 7, the maximum correction establishing circuit 9 is comprised of a synchronization signal detecting circuit 30 receiving binary signals having a value 0 or 1, generated from the data-receiving circuit 13, to thereby detect a synchronization signal in a radio signal having been received through the antenna 1 and the signal-receiving circuit 2, a correction control circuit 31 determining a correction for a phase of the symbol rate clock, a timing counter 32 equipped in the correction control circuit 31, a memory 36 storing a first correction 34 and a second correction 35 therein, and a selector 33 selecting one of the first and second corrections 34 and 35 in accordance with a signal transmitted from the correction control circuit 31.

The correction control circuit 31 selects one of the first and second corrections 34 and 35 through the selector 33, to thereby switch a maximum correction for a phase of the symbol rate clock. Herein, it is assumed that the first correction 34 is greater than the second correction 35.

It is considered that since a phase between a radio signal and the symbol rate clock is much deviated immediately after a radio signal has been received, the correction control circuit 31 selects the greater correction or the first correction 34.

After a synchronization signal has been detected by the synchronization signal detecting circuit 30, the correction control circuit 31 selects the smaller correction or the second correction 35.

In a radio signal transmitted from a radio communication device, a synchronization signal is first transmitted, and then, a message signal is transmitted. Hence, it is no longer necessary to correct a phase of the symbol rate clock with a greater correction after a synchronization signal has been once detected.

The timing counter 32 is allowed to temporarily switch a correction from the second correction 35 to the first correction 34, even if a correction has been switched from the first correction 34 to the second correction 35. A symbol rate may be changed in dependence on a signal transmission system, and a phase may be deviated at that time. In such a case, it is preferable to temporarily select a greater correction or the first correction 34 again for correcting a phase of the symbol rate clock.

An operation of the radio communication device in accordance with the second embodiment is explained hereinbelow.

Figure 8:
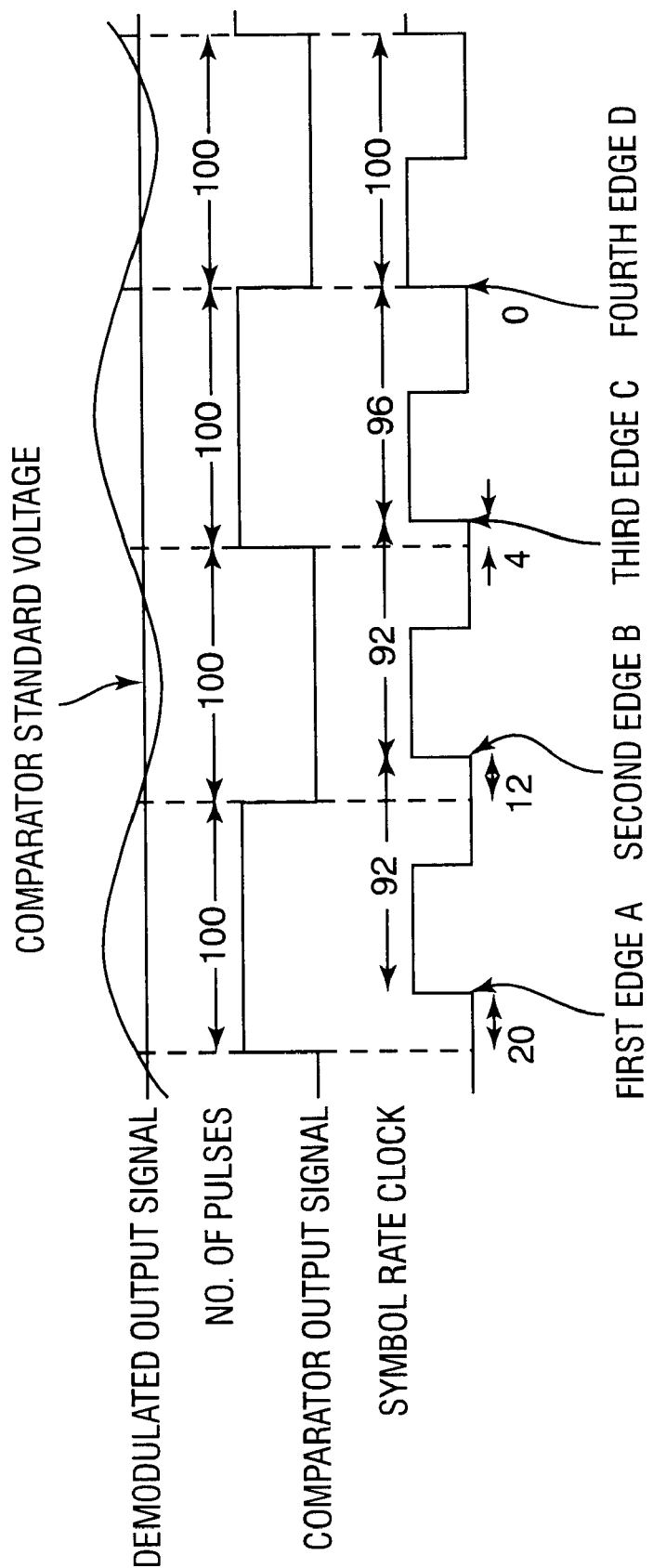
FIG. 8 is a timing chart showing an operation of the phase-difference correcting circuit.

As illustrated in FIG. 8, a received radio signal generally has a demodulated waveform in the form of a sine wave. Hence, it would be possible to enhance an accuracy at which a radio signal is received, by receiving a signal at a center of each of symbols, that is, at a location where an eye is open to the greatest degree. In the radio communication device in accordance with the second embodiment, a degree of phase follow-up is increased and an accuracy with which a radio signal is received is maintained relatively high when a difference in a phase between a radio signal and the symbol rate clock is relatively great, and the accuracy is emphasized when the difference in a phase is relatively small.

An operation of the phase-difference correcting circuit 8 is explained hereinbelow with reference to FIG. 8.

As illustrated in FIG. 8, the demodulated output signal 4 has a sine waveform. Herein, it is assumed that a symbol has a length equal to 100 pulses generated from the oscillator 10. The comparator output signal 5 repeats a high level and a low level in every two symbols. That is, a turning point between high and low levels of the comparator output signal 5 indicates a boundary of adjacent symbols. The symbol rate clock has the same rate as a rate of a received radio signal, namely, the symbol rate clock is a clock obtained by dividing a pulse signal transmitted from the oscillator 10 into 100 sections.

It is possible to receive a radio signal at a location where an eye is open to the greatest degree, by synchronizing a turning point of the comparator output signal 5 to a rise edge of the symbol rate clock, and receiving the demodulated output signal 4 at a fall edge of the symbol rate clock.

Herein, it is assumed that a maximum correction is determined to be equal to 8 by the maximum correction establishing circuit 9. That is, a maximum correction is equivalent to 8 pulses generated from the oscillator 10.

As illustrated in FIG. 8, a difference in a phase between a first rise edge A and the comparator output signal 5 is equal to 20 pulses. As illustrated in FIG. 6, the phase-difference correcting circuit 8 compares a difference in phase and the maximum correction, and selects a smaller one as a correction for a phase of the symbol rate clock. Herein, since the difference in a phase is equal to 20 pulses and the maximum correction is equal to 8 pulses, the maximum correction equal to 8 pulses is selected as a correction for a phase of the symbol rate clock. Hence, the phase-difference correcting circuit 8 corrects a phase of the symbol rate clock by 8 pulses.

As a result, a difference in a phase between a second rise edge B next to the first rise edge A and the comparator output signal 5 becomes equal to 12 pulses (20−8=12). However, since the maximum correction (8 pulses) is still smaller than the difference in phase (12 pulses), the phase-difference correcting circuit 8 corrects the phase of the symbol rate clock by 8 pulses in the next phase correction.

As a result, the difference in a phase between a third rise edge C to the second rise edge B and the comparator output signal 5 becomes equal to 4 pulses (12−8=4). At this stage, the difference in phase (4 pulses) becomes smaller than the maximum correction (8 pulses). Hence, the phase-difference correcting circuit 8 corrects the phase of the symbol rate clock only by 4 pulses in the next phase correction to thereby match a fourth rising edge D with a level turning point of the comparator output signal 5 in the phase.

Thus, a turning point of the comparator output signal 5 and the fourth rising edge D are synchronized with each other. By receiving the modulated output signal 4 at a fall edge coming next to the fourth rising edge D, it would be possible to receive a radio signal at a location where an eye is open to the greatest degree.

An operation of the maximum correction establishing circuit 9 is explained hereinbelow with reference to FIG. 9.

Figure 9:
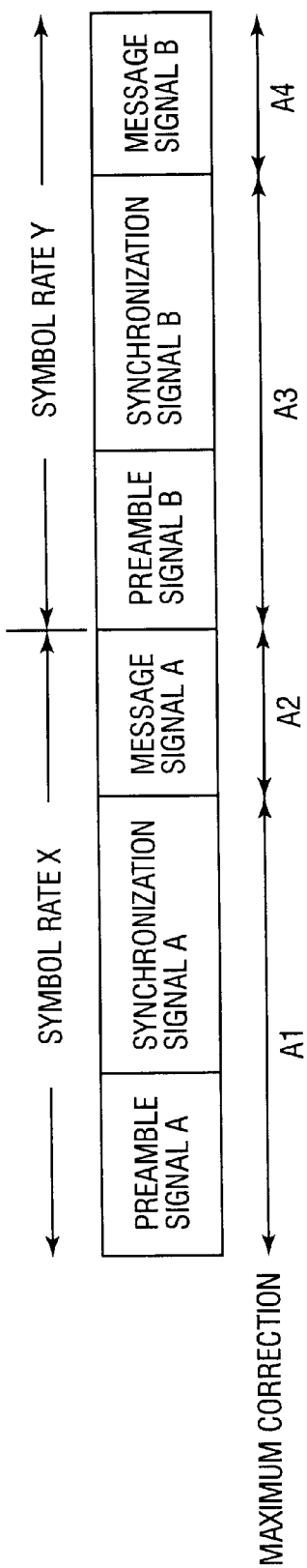
FIG. 9 is a timing chart showing an operation of the maximum correction establishing circuit illustrated in FIG. 7.

FIG. 9 illustrates an assumptive signal format. As illustrated in FIG. 9, it is assumed that a preamble signal A is first transmitted, and then, a synchronization signal A, a message signal A, a preamble signal B, a synchronization signal B, and a message signal B are transmitted in this order. It is also assumed that a symbol rate X is switched to a symbol rate Y at the time when transmission of the preamble signal B starts.

Herein, a preamble signal is a signal transmitted for accomplishing phase synchronization, and is comprised of a pattern of 1, 0, 1, 0, - - - . A synchronization signal is a signal indicating a starting position of a message signal following a synchronization signal, and is comprised of a fixed pattern.

The radio communication device starts searching the synchronization signal A after an operation of receiving a signal has been started. Since a phase synchronization has to be completed before the synchronization signal A is transmitted, that is, while the preamble signal A is being received, the radio communication device selects a correction A1 as a maximum correction.

However, if a maximum correction is set too great, even when a tuning point of the comparator output signal 5 is much deviated due to noises and so on, the phase of the symbol rate clock is much corrected in accordance with the maximum correction. This may considerably reduce the accuracy with which a radio signal is received. Hence, a maximum correction is switched from the correction A1 to a correction A2 at a timing when the synchronization signal A has been detected. Herein, the correction A2 is smaller than the correction A1. Since it can be considered that phase synchronization is almost completed when the synchronization signal A has been detected, it is no longer necessary to correct a phase of the symbol rate clock by a greater correction, that is, the maximum correction A1, at a later stage or while the message signal A is being received.

A symbol rate is switched from the symbol rate X to the symbol rate Y when the preamble signal B starts being received. Hence, a phase may be deviated again at this stage. Hence, the timing counter 32 (see FIG. 7) is designed to select a greater maximum correction while the preamble signal B is being received. Specifically, a correction A3 greater than the correction A2 is selected as a maximum correction. Selection of a greater maximum correction makes it possible swiftly follow phase deviation.

Since a signal is generally transmitted at a fixed timing, if a timing at which a first synchronization signal starts can be detected, it would be possible to estimate a timing at which following signals are transmitted.

When the synchronization signal B and the message signal B are received following the preamble signal B, a small correction for a phase of the symbol rate clock is selected. Specifically, a correction A4 smaller than the correction A3 is selected as a maximum correction. This ensures enhancement of an accuracy with which a phase is synchronized.

The correction A1 may be equal to the correction A3, and similarly, the correction A2 may be equal to the correction A4.

As having been explained so far, in accordance with the instant embodiment, it is possible to improve signal-receiving sensitivity of a radio communication device. The radio communication device in accordance with the instant embodiment appropriately controls an accuracy and a degree of follow-up with which phase synchronization is accomplished, to thereby make it possible to receive a radio signal at a location where an eye in a modulated output signal is open to the greatest degree. As a result, even if a field intensity of a received radio signal becomes weak, and hence, an eye is gradually closed, a received signal is less misjudged.

Figure 10:
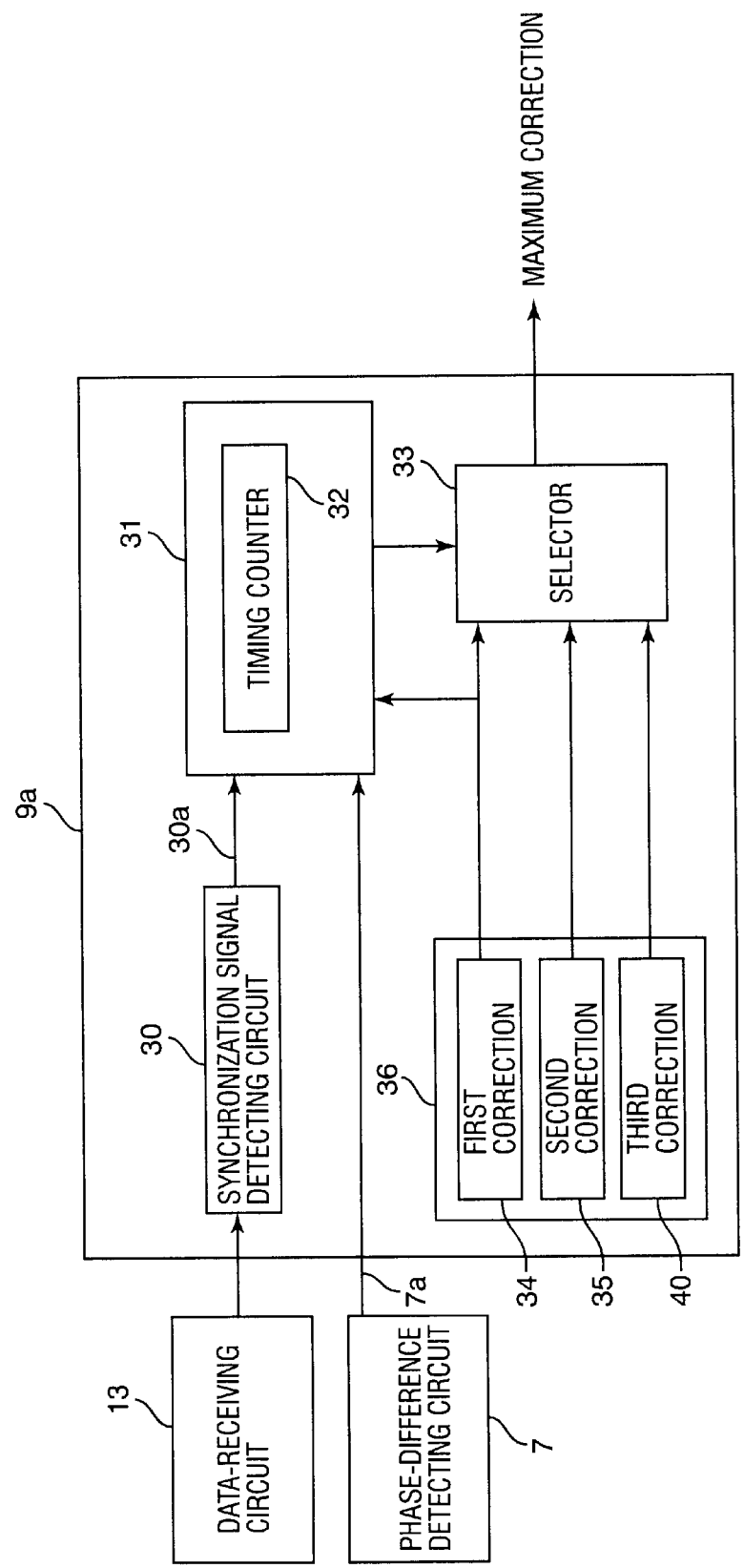
FIG. 10 is a block diagram of another example of the maximum correction establishing circuit.

FIG. 10 illustrates another example of a structure of the maximum correction establishing circuit.

As illustrated in FIG. 10, the maximum correction establishing circuit 9A is comprised of a synchronization signal detecting circuit 30 receiving binary signals having a value 0 or 1, generated from the data-receiving circuit 13, to thereby detect a synchronization signal in a radio signal having been received through the antenna 1 and the signal-receiving circuit 2, a correction control circuit 31 determining a correction for a phase of the symbol rate clock, a timing counter 32 equipped in the correction control circuit 31, a memory 36 storing a first correction 34, a second correction 35 and a third correction 40 therein, and a selector 33 selecting one of the first, second and third corrections 34, 35 and 36 in accordance with a signal transmitted from the correction control circuit 31.

The third correction 40 has a value intermediate between the first correction 34 and the second correction 35.

Figure 11:
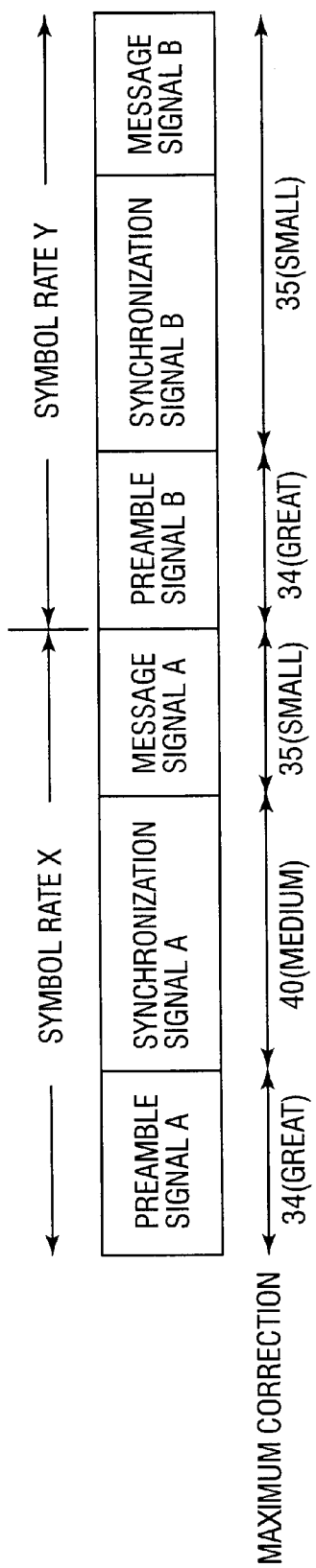
FIG. 11 is a timing chart showing an operation of the maximum correction establishing circuit illustrated in FIG. 10.

FIG. 11 is a timing chart showing an example of an operation of the maximum correction establishing circuit 9A.

As illustrated in FIG. 10, the correction control circuit 31 in the maximum correction establishing circuit 9A receives a phase-difference signal 7a indicative of a difference in a phase, detected by the phase-difference detecting circuit 7, the first correction 34, and a synchronization detecting signal 30a indicating whether a synchronization signal has been detected.

Similarly to the correction control having been explained with reference to FIG. 9, the correction control circuit 31 selects the first correction 34 as a maximum correction immediately after the correction control circuit 31 has started receiving a radio signal.

In the correction control illustrated in FIG. 9, the first correction 34 is kept alive until the synchronization signal A is detected. However, the difference in a phase sometimes becomes smaller than the first correction 34 even before the synchronization signal A is detected. If such a case occurs, the correction control circuit 31 judges that phase follow-up has been almost completed at a time when the difference in a phase has become smaller than the first correction 34, and then, switches a maximum correction from the first correction 34 to the third correction 40.

The reason why a maximum correction is not switched from the first correction 34 to the second correction 35 is that since there is possibility, though it might be small, that a phase is accidentally synchronized, it is not preferable to switch a maximum correction to a smaller correction before detecting a synchronization signal.

Then, the correction control circuit 31 switches a maximum correction from the third correction 40 to the second correction 35 when the synchronization signal has been detected.

Hereinafter, similarly to the correction control illustrated in FIG. 9, the correction control circuit 31 selects the first correction 34 while the preamble signal B is being received, and selects the second correction 35 while the synchronization signal B and the message signal B are being received.

As explained above, the maximum correction establishing circuit 9A switches a maximum correction for a phase of the symbol rate clock from the first correction 34 to the third correction 40, when the difference in a phase becomes smaller than the first correction 34, even if the first selection 34 is selected. This operation ensures enhancement of an accuracy for phase follow-up in the case that a synchronization signal is detected.

Third Embodiment

Figure 12:
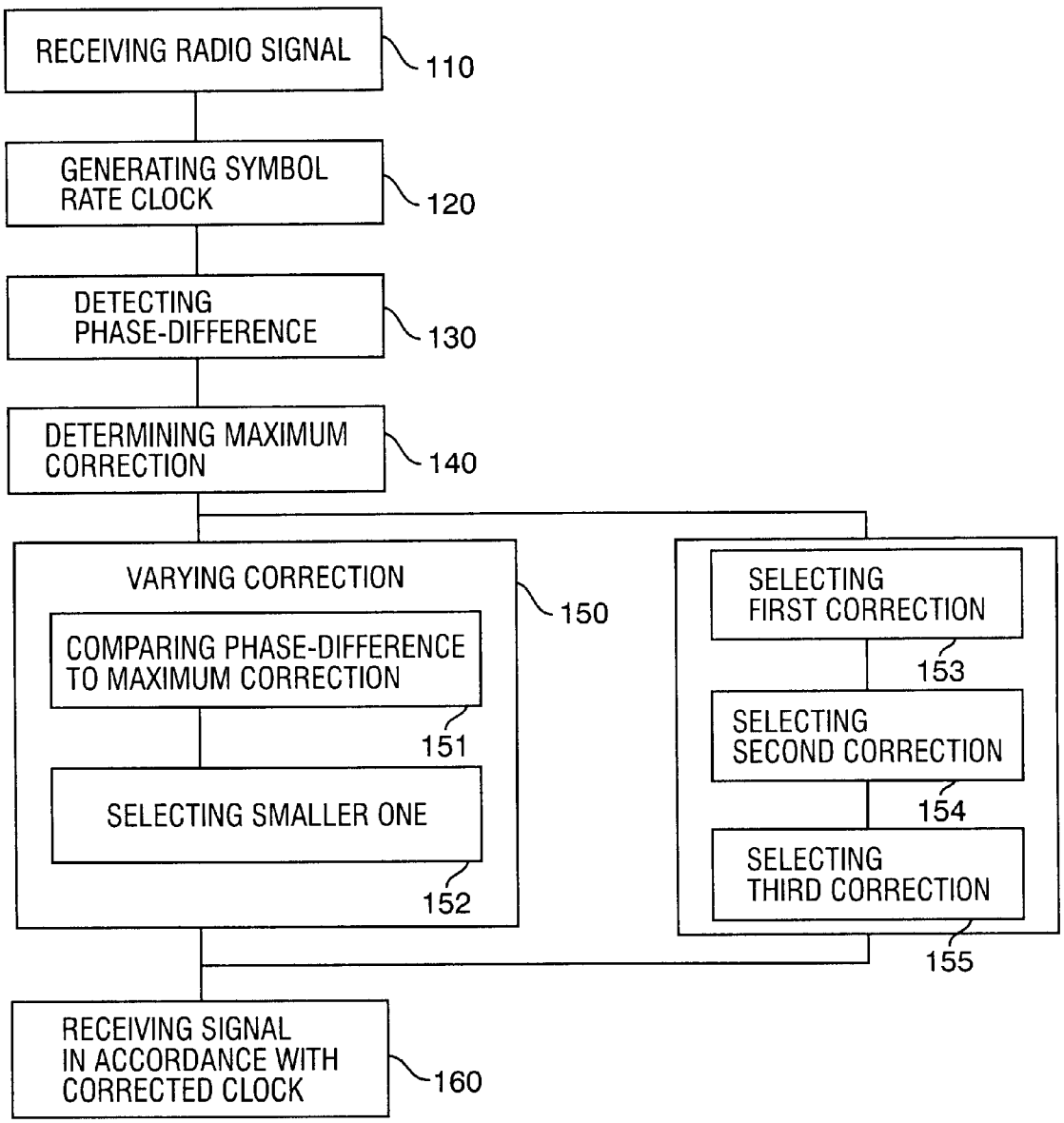
FIG. 12 is a flow chart of a method of accomplishing synchronization pull-in in a radio communication device, in accordance with an embodiment of the present invention.

FIG. 12 is a flow chart of a method of accomplishing synchronization pull-in in a radio communication device, in accordance with an embodiment of the present invention. In the instant embodiment, a radio communication device is constituted as a selective calling radio-receiver.

The radio communication device receives a radio signal in step 110.

Then, a symbol rate clock as a data-receiving clock is generated in step 120.

A difference in a phase between the received radio signal and the symbol rate clock is detected in step 130. Then, a maximum correction for a phase of the symbol rate clock is determined in step 140. The step 140 may be carried out prior to the step 130, and vice versa.

Then, in step 150, a correction for a phase of the symbol rate clock is varied in accordance with the difference in a phase, having been detected in step 130. Specifically, the difference in a phase and the maximum correction are compared to each other in step 151, and then, a smaller one is selected as a correction for a phase of the symbol rate clock in step 152.

Then, the radio signal is received in accordance with the symbol rate clock having a phase having been corrected, in step 160.

An example of varying the correction for a phase of the symbol rate clock in step 150 is explained hereinbelow.

There are prepared a first correction as a greater correction and a second correction as a smaller correction. First, in step 153, the first correction is selected immediately after the received radio signal has been introduced into the decoder 6. Then, the second correction is selected after a synchronization signal in the received radio signal has been detected, as shown in step 154.

If necessary, a third correction may be temporarily selected, even after the second correction has been selected, in step 155. Herein, the third correction may be designed to be equal to the first correction.

As having been explained so far, in accordance with the above-mentioned method, a correction for a phase of the symbol rate clock is varied in accordance with a difference in a phase between a received radio signal and the symbol rate clock, and a maximum correction for a phase of the symbol rate clock is also varied, which ensures higher accuracy with which a radio signal is received. As a result, it is possible to accomplish phase follow-up or synchronization pull-in at an enhanced rate and with higher accuracy.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-145428 filed on May 27, 1998 including specification, claims, drawings and summary is incorporated herein by reference in its entirety.

What is claimed is:

1. A radio communication device comprising:
   a signal receiving circuit receiving a radio signal and generating a demodulated output signal and a signal indicative of a phase of received radio signal;
   a data-receiving clock;
   a data receiving circuit which receives the demodulated output signal in accordance with said data-receiving clock;
   a phase-difference detecting circuit which receives the signal indicative of a phase of received radio signal and said data-receiving clock and generates a phase difference output signal;
   a phase-difference correcting circuit which receives the phase difference output signal and makes a correction for a phase of said data-receiving clock in accordance with a phase difference between said received radio signal and said data-receiving clock; and
   a maximum correction establishing circuit which establishes in advance a maximum correction for a phase of said data-receiving clock, said phase-difference correcting circuit being controlled by the maximum correction establishing circuit to establish the correction for the phase of said data-receiving clock within the thus established maximum correction, wherein said phase-difference correcting circuit makes the correction for the phase of said data-receiving clock equal to said maximum correction, when the phase difference between said received radio signal and said data-receiving clock is equal to or greater than said maximum correction, and makes the correction for the phase of said data-receiving clock equal to the phase difference between the received radio signal and said data-receiving clock, when said phase difference is smaller than said maximum correction.

2. The radio communication device as set forth in claim 1, wherein said maximum correction established by said maximum correction establishing circuit is variable.

3. The radio communication device as set forth in claim 1, further including an oscillator transmitting a pulse signal by which said data-receiving clock is generated, said phase difference being detected in the form of the number of pulse signals generated by said oscillator.

4. The radio communication device as set forth in claim 1, wherein said phase-difference correcting circuit is comprised of:

a comparator comparing said phase difference output signal to said maximum correction; and a selector selecting a smaller one between said phase difference output signal and said maximum correction in accordance with a comparison result provided from said comparator, and determining said smaller one as the correction for the phase of said data-receiving clock.

5. The radio communication device as set forth in claim 1, wherein said maximum correction establishing circuit is comprised of:

a memory storing therein a plurality of corrections having different values from one another; and a selector selecting one of said plurality of corrections.

6. The radio communication device as set forth in claim 1, wherein said maximum correction establishing circuit establishes a first maximum correction before a synchronization signal in said radio signal is detected, and establishes a second maximum correction after said synchronization signal has been detected, said second maximum correction being smaller than said first maximum correction.

7. The radio communication device as set forth in claim 5, wherein said maximum correction establishing circuit receives said phase difference output signal, and selects a first correction which is a maximum one among said plurality of corrections, and wherein said maximum correction establishing circuit switches the correction for the phase of said data-receiving clock from said first correction to a third correction smaller than said first correction in response to said phase difference output signal becoming smaller than said first correction, even when said maximum correction establishing circuit selects said first correction.

8. The radio communication device as set forth in claim 7, wherein said phase of said data-receiving clock is compensated for by said third correction until receipt of a synchronization signal in said radio signal has been completed.

9. The radio communication device as set forth in claim 7, wherein said third correction is next smaller than said first correction among said plurality of corrections.

10. The radio communication device as set forth in claim 1, wherein said radio communication device constitutes a selective calling radio-receiver.

11. A radio communication device including:

(a) a radio-receiving circuit which receives a radio signal, and transmits a demodulated signal and a phase-indicating signal in accordance with the received radio signal;

(b) a clock-generating circuit which generates a data-receiving clock;

(c) a data-receiving circuit which receives said demodulated signal in accordance with said data-receiving clock;

(d) a phase-difference detecting circuit which receives the phase-indicating signal and detects a difference in phase between said phase-indicating signal and said data-receiving clock;

(e) a phase-difference correcting circuit which varies a correction for a phase of said data-receiving clock in accordance with said difference in phase detected by said phase-difference detecting circuit; and (f) a maximum correction establishing circuit which establishes a maximum correction for the phase of said data-receiving clock, wherein said phase-difference correcting circuit makes the correction for the phase of said data receiving clock equal to said maximum correction, when the difference in phase between said phase-indicating signal and said data-receiving clock is equal to or greater than said maximum correction, and makes the correction for the phase of said data-receiving clock equal to the difference in phase between said phase-indicating signal and said data-receiving clock, when said difference in phase is smaller than said maximum correction.

12. The radio communication device as set forth in claim 11, further including:

an oscillator which supplies a pulse signal to said clock-generating circuit, said clock-generating circuit including a divider which divides said pulse signal.

13. The radio communication device as set forth in claim 11, wherein said maximum correction established by said maximum correction establishing circuit is variable.

14. The radio communication device as set forth in claim 11, further including an oscillator transmitting a pulse signal to said clock-generating circuit, said maximum correction being established in the form of the number of pulse signals generated by said oscillator.

15. The radio communication device as set forth in claim 11, further including an oscillator transmitting a pulse signal to said clock-generating circuit, said difference in a phase being detected in the form of the number of pulse signals generated by said oscillator.

16. The radio communication device as set forth in claim 11, wherein said phase-difference correcting circuit is comprised of:

a comparator comparing said difference in phase to said maximum correction; and a selector selecting a smaller one between said difference in phase and said maximum correction in accordance with a comparison result provided from said comparator, and determining said smaller one as the correction for the phase of said data-receiving clock.

17. The radio communication device as set forth in claim 11, wherein said phase-difference detecting circuit detects the difference in phase between a turning point of said phase-indicating signal and a rising edge of said data-receiving clock.

18. The radio communication device as set forth in claim 11, wherein said phase-difference correcting circuit corrects the phase of said data-receiving clock so that a turning point of said phase-indicating signal is synchronized to a rising edge of said data-receiving clock and said data-receiving circuit receives said demodulated signal at a falling edge of said data-receiving clock.

19. The radio communication device as set forth in claim 11, wherein said maximum correction establishing circuit is comprised of:
   (a) a synchronization signal detecting circuit which detects a synchronization signal constituting a part of said demodulated signal;
   (b) a memory which stores a plurality of corrections each having a different value from one another; and
   (c) a correction control circuit which selects the correction for the phase of said data-receiving clock among said plurality of corrections.

20. The radio communication device as set forth in claim 19, wherein said correction control circuit establishes a first maximum correction before said synchronization signal is detected, and establishes a second maximum correction after said synchronization signal detecting circuit has detected said synchronization signal, said second maximum correction being smaller than said first maximum correction.

21. The radio communication device as set forth in claim 20, wherein said correction control circuit temporarily selects said first correction after having selected said second correction.

22. The radio communication device as set forth in claim 19, wherein said correction control circuit receives said difference in phase, detected by said phase-difference detecting circuit, and a first correction which is a maximum one among said plurality of correction,
   and wherein said correction control circuit switches the correction for the phase of said data-receiving clock from said first correction to a third correction smaller than said first correction in response to said difference in phase becoming smaller than said first correction, even when said correction control circuit selects said first correction.

23. The radio communication device as set forth in claim 14, wherein said phase of said data-receiving clock is compensated for by said third correction until receipt of said synchroization signal has been completed.

24. The radio communication device as set forth in claim 22, wherein said third correction is next smaller than said first correction among said plurality of corrections.

25. The radio communication device as set forth in claim 11, wherein said radio communication device constitutes a selective calling radio-receiver.

26. A method of establishing synchronization in a radio communication device, including the steps of:
   (a) receiving a radio signal and generating a demodulated output signal and a signal indicative of a phase of the received radio signal;
   (b) generating a data-receiving clock;
   (c) receiving the demodulated output signal in accordance with said data-receiving clock;
   (d) detecting a difference between said signal indicative of a phase of the received radio signal and said data-receiving clock;
   (e) establishing in advance a maximum correction for a phase of said data-receiving clock; and
   (f) variably correcting a phase of said data-receiving clock in accordance with a difference in phase between said received radio signal and said data-receiving clock,
      wherein the correction for the phase of said data-receiving clock is equal to said maximum correction, when the difference in phase between said received radio signal and said data-receiving clock is equal to or greater than said maximum correction, and the correction for the phase of said data-receiving clock is equal to the difference in phase between the received radio signal and said data-receiving clock, when said difference in phase is smaller than said maximum correction.

27. The method as set forth in claim 26, wherein said phase of said data-receiving clock is corrected in step (f) within said maximum correction.

28. The method as set forth in claim 27, further including the step of varying said maximum correction.

29. The method as set forth in claim 26, wherein a plurality of corrections each having a different value from one another is established in advance, and wherein one of said corrections is selected, and said phase of said data-receiving clock is corrected in step (f) with the thus selected correction.

30. The method as set forth in claim 29, wherein a first correction is selected before a synchronization signal in said radio signal is detected, and a second correction smaller than said first correction is selected after said synchronization signal has been detected.

31. The method as set forth in claim 30, wherein the correction for the phase of said data-receiving clock is switched from said first correction to a third correction smaller than said first correction in response to said difference in phase becoming smaller than said first correction, even when said first correction is selected.

32. The method as set forth in claim 31, wherein said third correction is smaller than said first correction among said plurality of corrections and larger than said second correction.

33. The method as set forth in claim 32, wherein said phase of said data-receiving clock is corrected by said third correction until receipt of said synchronization signal has been completed.

34. A method of establishing synchronization in a radio communication device, including the steps of:
   (a) receiving a radio signal, and transmitting a demodulated signal and a phase-indicative signal in accordance with the thus received radio signal;
   (b) generating a data-receiving clock;
   (c) detecting a difference in phase between said phase-indicative signal and said data-receiving clock;
   (d) establishing a maximum correction for a phase of said data-receiving clock;
   (e) varying a correction for the phase of said data-receiving clock in accordance with said difference in phase; and
   (f) receiving said demodulated signal in accordance with said data-receiving clock having a phase having been corrected in said step (e), wherein said step (e) is comprised of:
      (e1) comparing said difference in phase to said maximum correction; and
      (e2) selecting a smaller one between said difference in phase and said maximum correction in accordance with a result of said step (e1), and determining the thus selected smaller one as the correction for the phase of said data-receiving clock.

35. The method as set forth in claim 34, wherein a difference in phase between a turning point in said phase-indicative signal and a rising edge in said data receiving clock is detected in said step (c).

36. The method as set forth in claim 34, wherein the phase of said data receiving clock is corrected in said step (e) so that a turning point of said phase-indicative signal is synchronized to a rising edge of said data-receiving clock and said phase-indicative signal is received at a falling edge of said data-receiving clock.

37. The method as set forth in claim 34, wherein a first correction is selected before a synchronization signal in said radio signal is detected, and a second correction smaller than said first correction is selected after said synchronization signal has been detected.

38. The method as set forth in claim 37, wherein said first selection is temporarily selected even after said second correction has been selected.

39. The method as set forth in claim 37, wherein the correction for the phase of said data-receiving click is switched from said first correction to a third correction smaller than said first correction in response to said difference in phase becoming smaller than said first correction, even when said first correction is selected.

40. The method as set forth in claim 39, wherein said phase of said data-receiving clock is corrected by said third correction until receipt of said synchronization signal has been completed.

41. The method as set forth in claim 26, wherein said radio communication device constitutes a selective calling radio-receiver.

42. The method as set forth in claim 34, wherein said radio communication device constitutes a selective calling radio-receiver.

* * * * *